United States Patent
Mayer et al.

(10) Patent No.: US 8,586,402 B2
(45) Date of Patent: Nov. 19, 2013

(54) METHOD FOR THE PRECISION PROCESSING OF SUBSTRATES

(75) Inventors: Kuno Mayer, Freiburg (DE); Monica Aleman, Brussels (BE); Daniel Kray, Freiburg (DE); Stefan Glunz, Freiburg (DE); Ansgar Mette, Leipzig (DE); Ralf Preu, Freiburg (DE); Andreas Grohe, Berlin (DE)

(73) Assignees: Fraunhofer-Gesellschaft zur föderung der angewandten Forschung e.V., München (DE); Albert-Ludwigs-Universität Freiburg, Freiburg (DE)

( * ) Notice: Subject to any disclaimer, the term of this patent is extended or adjusted under 35 U.S.C. 154(b) by 526 days.

(21) Appl. No.: 12/530,167

(22) PCT Filed: Mar. 6, 2008

(86) PCT No.: PCT/EP2008/001807
§ 371 (c)(1),
(2), (4) Date: Feb. 9, 2010

(87) PCT Pub. No.: WO2008/107194
PCT Pub. Date: Sep. 12, 2008

(65) Prior Publication Data
US 2010/0144079 A1 Jun. 10, 2010

(30) Foreign Application Priority Data
Mar. 6, 2007 (DE) .......................... 10 2007 010 872

(51) Int. Cl.
*H01L 21/00* (2006.01)
(52) U.S. Cl.
USPC .................. 438/96; 438/795; 257/E21.34
(58) Field of Classification Search
USPC .................. 438/96, 795; 257/E21.347
See application file for complete search history.

(56) References Cited

U.S. PATENT DOCUMENTS

| 4,639,378 A | 1/1987 | Inoue |
| 5,059,449 A | 10/1991 | van der Putten et al. |
| 6,429,037 B1 | 8/2002 | Wenham et al. |
| 7,951,637 B2 * | 5/2011 | Weidman et al. ............ 438/57 |
| 7,985,610 B2 * | 7/2011 | You ............................... 438/44 |
| 2003/0172969 A1 | 9/2003 | Jenson et al. |
| 2004/0242019 A1 | 12/2004 | Klein et al. |
| 2005/0003594 A1 | 1/2005 | Koezuka et al. |
| 2008/0210298 A1 | 9/2008 | Kuebelbeck et al. |

FOREIGN PATENT DOCUMENTS

| DE | 10 2005 032807 A1 | 1/2007 |
| GB | 2188774 A | 10/1987 |
| JP | 10-212585 | 8/1998 |

OTHER PUBLICATIONS

Ametowobla et al., "Laser Processing of Silicon Solar Cells," IEEE (2005).
Green et al., "Present Status of Buried Contact Solar Cells," IEEE Transactions on Electron Devices, pp. 46-53 (1991).
Pearlstein, F., "Electroless Plating," *Modern Electroplating*, 3rd edition, Frederick Lowerheim Ed., Wiley, pp. 710-744 (1974).
Wang et al., "Laser-induced selective deposition of Ni-P alloy on silicon," Applied Surface Science, vol. 84, pp. 383-389 (1995).

* cited by examiner

*Primary Examiner* — Mary Wilczewski
*Assistant Examiner* — Toniae Thomas
(74) *Attorney, Agent, or Firm* — Leydig, Voit & Mayer, Ltd.

(57) ABSTRACT

The invention relates to a method for the precision processing of substrates, in particular for the microstructuring of thin layers, local dopant introduction and also local application of a metal nucleation layer in which a liquid-assisted laser, i.e. laser irradiation of a substrate which is covered in the regions to be processed by a suitable reactive liquid, is implemented.

28 Claims, No Drawings

METHOD FOR THE PRECISION PROCESSING OF SUBSTRATES

CROSS-REFERENCE TO RELATED APPLICATIONS

This patent application is a national stage application of international patent application PCT/EP2008/001807, filed Mar. 6, 2008, which claims the benefit of DE 10 2007 010 872.0, filed Mar. 6, 2007, which is incorporated herein by reference.

The invention relates to a method for the precision processing of substrates, in particular for the microstructuring of thin layers, local dopant introduction and also local application of a metal nucleation layer in which a liquid-assisted laser, i.e. laser irradiation of a substrate which is covered in the regions to be processed by a suitable reactive liquid, is implemented. According to the application, the liquid, the laser source and the method parameters can thereby be adapted. In particular, the method can be used with different laser-chemical combinations for the solar cell processing, dielectric layers being microstructured and, simultaneously or successively, in addition local doping and nucleation layer deposition being able to be produced for the electrical contacting.

The production of solar cells involves a large number of process steps for the precision processing of wafers. There are included herein inter alia emitter diffusion, application of a dielectric layer and also microstructuring thereof, doping of the wafer, rear-side contacting, application of a nucleation layer and also thickening thereof.

In the microstructuring of dielectric layers of conventional solar cells, generally a firing process is applied, in which a locally applied glass frit-containing printing paste is fired through the $SiN_x$ layer situated thereunder by means of a temperature step at approx. 800 to 900° C. Alternatively, the $SiN_x$ layer is ablated locally by irradiation with a laser and the resulting crystal damage is subsequently removed in a wet-chemical manner.

In the case of microstructuring for masking processes, normally a procedure in several steps is chosen, e.g. by printing a resistant paste and a subsequent wet-chemical step. Furthermore, the masking paste is subsequently removed in a wet-chemical manner. Analogously, microstructuring by photolithography is possible, i.e. application (spraying/centrifugation) of a light-sensitive varnish, exposure of the desired structure through a shadow mask, development and dissolving of the exposed (positive varnish) or non-exposed (negative varnish) regions, wet-chemical or plasma-technological removal of the dielectric layer in the opened regions, wet-chemical removal of the varnish.

In the case of selective emitter doping, a selective emitter is converted in a solar cell concept by BP Solar. Channels are introduced by laser irradiation into the $SiN_x$-coated frontside, the resulting laser damage is removed in a wet-chemical manner and subsequently the local n-high doping (selective emitter) is implemented by a $POCl_3$ diffusion.

The concept of laser doping hereby represents the latest state of the art (Ametowobla M., Esturo-Bretón A., Köhler J. R., Werner J. H.: "Laser Processing of Silicon Solar Cells", IEEE (2005)). A closed layer of a phosphorus-containing substance is hereby applied on the wafer surface and forms there a phosphorus silicate glass during a tempering step. By means of local heating with the help of a laser beam, the phosphorus is introduced into the silicon. The phosphorus glass must be removed again after the doping step in a further partial step generally by etching with hydrofluoric acid mixtures.

The state of the art in front-side contacting of standard solar cells is the printing of $SiN_x$ layers with metal paste which contains a glass frit and contains generally silver or tin as contact metal. The screen printing process thereby serves as predominant printing technique. After application, the paste is firstly dried, the organic solvent being expelled and then being fired at high temperatures (approx. 900° C.). In the course of this sintering step, the glass frit attacks the $SiN_x$ layer, dissolves it locally and enables as a result the formation of a silicon-metal contact. The metal contact can be subsequently thickened again galvanically for reducing the conduction resistance before the front-side contacts can be soldered thereon.

The high contact resistance which is caused by the glass frit ($>10^{-3}$ $\Omega cm^2$) and the necessary high process temperatures which can reduce the quality of the passivation layers and also of the silicon substrate are disadvantageous in this process.

A gentle option for opening the $SiN_x$ layer locally resides in the application of photolithography combined with wet-chemical etching methods. Firstly a photoresist layer is thereby applied on the wafer and structured via UV exposure and development. A wet-chemical etching step follows in a hydrofluoric acid-containing chemical system which removes the $SiN_x$ at the positions at which the photoresist has been opened. A great disadvantage of this method is the enormous complexity and the costs associated therewith. In addition, no sufficient throughput can be achieved with this method for commercial solar cell production. In the case of some nitrides, in addition the method described here cannot be applied since the etching rates of the etching systems which are used within the given parameter window are too low in the case of standard wet-chemical methods.

The principle of damage-free removal of silicon nitride in this method is based on the fact that the laser beam heats the silicon nitride with suitable choice of the laser parameters such that it undergoes a reaction with the phosphoric acid entrained in the liquid jet, whilst the emitter layer of the silicon, which is situated below the silicon nitride layer and is only a few nanometers thick escapes attack.

In this way, contact points in the silicon nitride can be opened more economically than with the other methods described here. However, the problem of metal contacting with as low as possible contact resistance still remains unresolved here. The formation of a metal contact is effected only in further subsequent process steps with this approach.

Currentless nickel deposition is preferred at present to galvanic deposition of nickel on the basis of numerous advantages, amongst which there are above all the following aspects (Pearlstein, F: Electroless Plating in: "Modern Electroplating", $3^{rd}$ edition, Ed.: Frederick Lowerheim, Wiley (1974), 710-744):

A more uniform deposition without preferential treatment of topographically exposed regions or edges is possible.
The layers deposited without current have lower porosities than those deposited galvanically.
No current supply and contacting is required. This implies significant technical simplification relative to galvanic deposition.
Deposition directly onto non-conductive materials is also possible.
The deposited layers have uniform chemical and mechanical properties.

Essential components of nickel baths are:
1) A nickel salt e.g. $NiCl_2.(x\ H_2O)$, $NiSO_4.(x\ H_2O)$ etc.
2) A reduction agent (predominantly a hypophosphite, $H_2PO_2^-$ or boranes, e.g. $B_2H_6$)

3) One or more salts of organic acids which are complex formers for Ni ions and at the same time are buffers. There should be mentioned here as examples: various citrates, tartrates, lactates, acetates etc.

The deposition process is effected by catalytic dehydrogenation of hypophosphite in conjunction with transfer of hydride ions to the catalytic surface and subsequent reaction of hydride ions with $Ni^{2+}$ ions.

Standard nickel baths for currentless deposition of nickel have high instability which leads inter alia frequently to nickel precipitating in practice in an undesired manner.

In the case of currentless nickel deposition, the surface of the workpiece to be coated with nickel is immersed in a heated nickel solution. However, deposition of nickel only takes place at those places at which the surface of the workpiece acts catalytically. In the case of standard currentless nickel deposition, this is ensured in that the regions to be coated are provided with a different metal nucleation layer, generally with a platinum metal, e.g. Pd or Pt. A more economical alternative hereto is the nucleation with tin.

More recent works have shown that surfaces of semiconductors during currentless deposition of nickel can also act catalytically when they are highly doped, have local crystalline damage which was caused for example by irradiation with laser light or mechanical effects or have a very large effective surface, for instance due to a highly porous property. Electron/hole pairs which are generated locally by irradiation with laser light or other energy-rich radiation can also act catalytically.

Wang J., Xudong F., Zuzhan Y., Zhao G: "Laser-induced selective deposition of Ni—P alloy on silicon, Applied Surface Science 84 (1995) 383-389", deposited nickel in this way from a standard nickel bath onto porous p-type silicon in that they exposed the surface locally with an $Ar^+$ ion laser of the wavelength $\lambda=514.5$ nm and laser powers between 65 $W/cm^2$ and 88 $W/cm^2$ over a duration of 15 to 30 min.

A method is known from U.S. Pat. No. 5,059,449 in which both semiconductors, metals and insulator surfaces can be covered with a metal layer without current, circumventing the use of standard phosphorus-containing reduction agents, such as for example hypophosphite. The substrate surface is thereby irradiated with a laser through a metal salt solution, the laser light causing a thermal decomposition locally of various hydrogen compounds in the solution. The hydrogen formed in this way thereby serves as reduction agent for the nickel. Preferred hydrogen sources here are ammonia and cyclohexanol.

The most progressive processing to date of front-side contacts in the case of commercial silicon solar cells is effected with the so-called BC ("buried contact") solar cells, such as for example the SATURN® solar cell by the company BP Solarex.

According to a standard emitter diffusion with $POCl_3$ as source of phosphorus and subsequent application of an antireflection layer with PECVD methods, channels of maximum 50 μm depth and 20 to 30 μm width are cut here with the help of a dry laser beam through the emitter into the silicon bulk situated thereunder. The thereby damaged material is removed within a subsequent etching step from the cut channels. A second diffusion step follows, in the course of which a highly doped region ($n^{++}$) is produced in the channels and on the rear-side of the wafer. The antireflection layer on the front-side protects the flat emitter from further introduction of doping atoms. After the diffusion step, the phosphorus silicate glass is removed from the channels by an etching step with hydrofluoric acid-containing solutions. On the highly doped walls of the channels, nickel is deposited without current in the form of a thin but closed layer. Galvanically deposited copper in the channels serves as metal contact in the solar cell manufactured in this way.

BC solar cells, relative to standard solar cells with screen printing contacts, have a series of different advantages (Green M. A., Wenham S. R., Zhao J., Bowden S., Milne A. M., Taouk M., Zhang F.: "Present Status of Buried Contact Solar Cells", IEEE Transactions on Electron Devices, (1991), 46-53):

1) By using lasers as microstructuring instrument, substantially finer structures can be achieved during the contacting than with screen printing technology.
2) The metal mixture chosen for the contacting and deposited in the channels has higher conductivity than the contacts sintered from the silver pastes. The higher conductivity of the contact leads in turn to a reduction in the series resistance of the solar cell.
3) Although the contact face is increased, the shading losses on the solar cell surface caused by the contacts are reduced. Less shading means an increase in the short circuit current at the same time.
4) The highly doped region around the contacts forms an effective diffusion barrier for the minority charge carriers and for the copper which is very damaging for silicon solar cells but used here as contact metal.

Starting herefrom, it was the object of the present invention to simplify the technical processing implementation of the individual method steps for the precision processing of substrates, in particular wafers, and, at the same time, to enable higher precision of these process steps.

This object is achieved by the features of the method described herein and advantageous developments thereof. Uses according to the invention are also described.

According to the invention, a method for the precision processing of substrates is provided, in which a laser beam directed towards a substrate surface is guided over the regions of the substrate to be processed, the substrate being covered at least at the regions of the substrate to be processed by a liquid containing a processing reagent.

The method according to the invention is based on the liquid-assisted laser and, according to the application, uses liquids with different processing reagents or different laser sources. Advantageously, process sequences for the production of solar cells are produced from these possibilities.

The method according to the invention is based on the fact that the substrate is covered at least in regions with a liquid containing a processing reagent, advantageously the thickness of the liquid layer in this region being precisely controlled and thereby preventing wave- or liquid movements arising. A laser beam is directed towards this region of the substrate and, taking into account the reflection, refraction and scattering on the liquid surface, is focused upon the substrate. As a result, thermo- or photochemical reactions can be initiated at the irradiated places, the local heating of the material ensuring a local convection current and therefore a good exchange of reactive chemicals.

According to the invention, the laser light thereby attends to various tasks: firstly, at the impingement point on the substrate surface, it is able to heat the latter locally, optionally thereby to melt it and in the extreme case to evaporate it. As a result of the simultaneous presence of chemicals with the heated substrate surfaces, chemical processes which do not take place under standard conditions because they are kinetically restricted or are thermodynamically unfavourable can be activated. In addition to the thermal effect of the laser light, photochemical activation is also possible in that the laser light generates for example electron-hole pairs on the surface of the substrate, said electron-hole pairs being able to promote the course of redox reactions in this region or in fact make them possible in the first place.

The liquid layer thereby enables, by means of strong local convection currents, rapid liquid exchange and also a more effective cooling in comparison with laser methods under a protective gas atmosphere.

Laser beam and liquid layer together form a new process tool which, in combination thereof, is in principle superior to the individual systems which it comprises.

All the chemical processes which take place during the microstructuring, doping or metallisation of silicon solar cells take place at increased temperatures. This implies conversely that the chemicals required for this purpose do not react or only very poorly under standard conditions.

$SiN_x$, which is used predominantly as antireflection layer on silicon solar cells, can itself be etched, at temperatures which are very high for liquids (over 150° C.), only at very low etching rates of merely a few 100 nm to a few µm per hour. The attacking etching particle is generally the proton which can originate from various acids; however, because of the high temperatures required for the etching process, predominantly concentrated phosphoric acid is used, the boiling point of which is at approx. 180°, with which it has the highest boiling point amongst all common industrial acids which are economically available commercially. The etching reaction takes place according to the diagram:

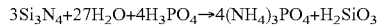

$$3Si_3N_4 + 27H_2O + 4H_3PO_4 \rightarrow 4(NH_4)_3PO_4 + H_2SiO_3$$

Standard nickel galvanising baths operate from temperatures of at least 70° C., however usually—according to the composition—are effective only from 90-100° C.

The formation of the phosphorus silicate glass from phosphoryl chloride $POCl_3$ or phosphoric acid with subsequent phosphorus diffusion is effected at temperatures above 800° C.

The reagents used in the individual process steps have significant chemical parallels: in all three process steps, phosphorus-containing substances are used, but with partly different oxidation steps of the phosphorus. The latter has, in the phosphoric acid, the oxidation step +V whilst, in the hypophosphite, it has the oxidation number +I and is there correspondingly a strong reduction agent, whilst the hydrogen phosphate ion displays neither a strong reduction nor oxidation tendency. The reduction tendency of the hypophosphite is dependent upon the pH value of the solution; in basic solutions, it is higher than in the neutral or acidic medium. In contrast, the etching effect of the phosphoric acid on the silicon nitride is best only in acidic solutions. In the case of phosphorus silicate glass formation, the pH value of the phosphorus-containing substance which is used is less important than the saturation of the valencies of the phosphorus with oxygen atoms. These are required for network formation in the phosphorus silicate glass where they form the bond bridges between the silicon and the phosphorus atoms. The phosphoric acid is correspondingly a better glass former than for example phosphorous acid or hypophosphite. The glassification of the low-oxygen phosphoryl chloride is effected for this reason only in an atmosphere containing oxygen.

The composition of the individual reaction media, the chemistry of the phosphorus and its oxygen compounds and also the fact that, in all three process steps, temperatures which are increased up to in part very high are required, enables a combination of the three process steps: nitride structuring, phosphorus doping and metallisation of silicon solar cells in a single high-temperature step.

The substrate is preferably immersed in the liquid containing the processing reagent.

The substrate is preferably selected from the group consisting of silicon, glass, metal, ceramic, plastic material and composite materials thereof. The substrate can thereby preferably have also one or more coatings on the surface to be treated. There are included herein coatings made of $SiN_x$, $SiO_2$, $SiO_x$, $MgF_2$, $TiO_2$ or $SiC_x$.

There are possible as usable types of laser different solid lasers, in particular the Nd:YAG laser which is frequently used commercially of wavelengths 1064 nm, 532 nm, 355 nm, 266 nm and 213 nm, diode lasers with wavelengths <1000 nm, argon-ion lasers of wavelength 514-458 nm and excimer lasers (wavelengths: 157-351 nm).

The tendency is for the quality of the microstructuring to increase with a reducing wavelength because increasingly the energy induced by the laser in the surface layer thereby continues to be concentrated better on the surface, which has a tendency to reduce the heat-affected zone and, associated therewith, to reduce the crystalline damage in the material, above all in the phosphorus-doped silicon below the passivation layer. In this context, blue lasers and lasers in the near UV range (e.g. 355 nm) and lasers with pulse lengths in the femtosecond to nanosecond range have proved to be particularly effective.

For the doping step, infrared lasers are in contrast better suited because they have a greater penetration depth than UV lasers and can produce deeper melting zones in this way, which allow a greater doping depth.

By using in particular short-wave laser light, the option of a direct generation of electron/hole pairs in the silicon exists in addition, which can be used for the electrochemical process during the nickel deposition. Thus, free electrons in the silicon, which are generated for example by laser light, can contribute, in addition to the redox process, already described above, of the nickel ions with phosphorous acid or hypophosphite, directly to the reduction of nickel on the surface. This electron/hole generation can be maintained permanently by permanent illumination of the sample with defined wavelengths (in particular in the near UV with $\lambda \leq 355$ nm) during the structuring process and can promote the metal nucleation formation process in a sustained manner.

For this purpose, the solar cell property can be used in order to separate the excess charge carrier via the p-n junction and hence to charge the n-conducting surface negatively.

A further preferred variant of the method according to the invention provides that the laser beam is adjusted actively in temporal and/or spatial pulse form. Included herein are the flat top form, an M-profile or a rectangular pulse.

The precision processing according to the invention can, in a first preferred variant, include an emitter diffusion of a dopant in a silicon wafer as substrate.

By means of local heating of the substrate by the laser beam, the temperatures required for the diffusion in the substrate can be produced within this limited region and the dopant can be introduced. Since the diffusion at low temperatures is effected only extremely slowly, doping of the substrate is achieved hence only in the region of the impinging laser radiation, whilst no change is produced in the adjacent regions of the substrate.

By means of the method according to the invention, crystal damage with local doping is avoided since the surface temperature due to the laser irradiation can be maintained below the melting point. In addition, a temperature loading of the entire substrate is avoided.

With respect to the dopants contained in the liquid, all the dopants known from the state of the art can be used. For particular preference, dopants are selected here from the group consisting of phosphorus, boron, indium, gallium and mixtures hereof.

A further preferred variant provides that, before or after one of the steps for the precision processing of the substrate, a dielectric layer is deposited on the substrate. This layer serves for passivation of the substrate.

The dielectric layer is thereby preferably selected from the group consisting of $SiN_x$, $SiO_2$, $SiO_x$, $MgF_2$, $TiO_2$ or $SiC_x$.

A further preferred variant of the method according to the invention provides that, during the precision processing, a microstructuring of the above-described dielectric layer is effected.

The microstructuring is based on opening of the dielectric layer which is opened preferably by treatment with a dry laser.

It is thereby preferred that the dielectric layer is opened by treatment with the laser, and the substrate is covered by a liquid containing a processing reagent, the processing reagent being an etching agent which has a stronger etching effect on the dielectric layer than on the substrate. An etching agent is thereby selected preferably as processing reagent, with which etching agent damage in the substrate can be subsequently etched also. Preferred etching agents are selected from the group consisting of $H_3PO_4$, KOH, HF/$HNO_3$, chlorine compounds and sulphuric acid.

The liquid can comprise in a particularly preferred manner pure or highly concentrated phosphoric acid or also diluted phosphoric acid. The phosphoric acid can be diluted for example in water or a different suitable solvent and be used in a different concentration. Supplements can also be added in order to change the pH value (acids or lyes), wetting behaviour (e.g. surfactants) or viscosity (e.g. alcohols). Particularly good results are achieved when using a liquid which contains phosphoric acid with a proportion of 50 to 85% by weight. In particular, rapid processing of the surface layer can hence be achieved without damaging the substrate and surrounding regions.

By means of the microstructuring according to the invention, two things are achieved with very little complexity.

On the one hand, the surface layer can be completely removed in the mentioned regions without the substrate thereby being damaged because the liquid has less (preferably none at all) etching effect on the latter. At the same time, due to the local heating of the surface layer in the regions to be removed, as a result of which preferably these regions are heated exclusively, removal of the surface layer which is well localised and restricted to these regions is made possible. This results from the fact that the etching effect of the liquid increases typically with increasing temperature so that damage to the surface layer in adjacent, unheated regions due to parts of the etching liquid possibly reaching there is extensively avoided.

In order to achieve as advantageous as possible metal contacting with as low as possible contact resistance, in the present invention the liquid in addition to the etching agent has, during the microstructuring, a reduction agent and furthermore optionally a metal salt. Advantageously, the etching agent and the reduction agent thereby have one and the same chemical element, e.g. phosphorus, in different oxidation steps. In particularly advantageous embodiments, the following pairs are used hence in the component system: $H_3PO_4$ as etching agent and $H_3PO_3$ as reduction agent; $H_2SO_4$ as etching agent and $H_2SO_3$ as reduction agent; $HNO_3$ as etching agent and $HNO_2$ as reduction agent. Advantageously, supplements of KF ensure a defined quantity of free hydrofluoric acid which also increases the etching rate on the SiN. There can be used as metal salt particularly advantageously salts of silver, of nickel, of tin, of Pb, of aluminium or of chromium. With the help of the reduction agent, a higher doping of the emitter layer or substrate layer, with respect to the dopant concentration, is possible, which improves a subsequent, for example galvanic, metal deposition and reduces the contact resistance. By adding a metal salt, a reduction in metal ions to form elementary metal is possible with the help of the reduction agent at the heated local surface regions, which leads to formation of effective deposition nuclei for a subsequent galvanisation process. Such a deposition of metal particles hence likewise leads to a metal contact with low contact resistance being able to be formed.

As a result of the metal contactings being improved to such an extent, the conductivity of solar cells produced in this way is improved without increased processing complexity resulting.

In the case of typical applications of the microstructuring according to the invention, the surface layer will have a thickness of between 1 nm and 300 nm. The substrate can have a layer thickness of between 25 µm and 800 µm in the case of typical applications of the method. A construction suitable for example for the production of solar cells would hence result.

The following aspects of the present invention can be regarded as advantageous developments relative to the microstructuring processes known from the state of the art:

1) The liquid-assisted laser process is mask-free, i.e. no application and removal of a masking layer is required.
2) The removal of coatings or substrate material is effected without damage, i.e. no subsequent cleaning or subsequent etching is required.

A particularly preferred variant provides that the microstructuring and the doping are implemented simultaneously. A further variant according to the invention comprises doping of the microstructured silicon wafer being effected subsequent to the microstructuring during the precision processing and the processing reagent being a dopant.

This can be achieved in that, instead of the liquid containing at least one dopant, a liquid containing at least one compound which etches the solid material is used. This variant is particularly preferred since, in the same device, firstly the microstructuring and, by exchanging the liquids, subsequently the doping can be implemented.

The method according to the invention likewise includes, as further variant, that doping is produced in the substrate only in regions during the precision processing, subsequently liquid located on the substrate surface dries in and the substrate is treated thermally so that the substrate has a weak surface doping and high local doping introduced.

The dopant used is preferably selected from the group consisting of phosphoric acid, phosphorous acid, boron compounds, gallium compounds and mixtures hereof.

Relative to doping processes known from the state of the art, the following aspects of the present invention can be regarded as advantageous developments:

3) No further tempering step is absolutely necessary during doping with the new method.
4) In comparison with previous methods, very high doping concentrations (approx. $10^{21}$ P-atoms/$cm^3$) and, associated therewith, low contact resistances are achieved with relatively low technical complexity.

According to a further variant of the method according to the invention, the precision processing includes application of a nucleation layer at least in regions on a silicon wafer. This hereby involves therefore a metallisation step.

It is thereby preferred that, subsequent to the doping, a metallisation of the doped surface regions is implemented by exchanging the liquid containing the dopant for a liquid containing at least one metal compound. It is particularly simple here again also to implement the method steps of doping and metallisation sequentially in the same device by exchanging the corresponding liquids.

The application can be effected thereby by nickel galvanisation, nickel-laser methods, inkjet methods, aerosol methods, vapour deposition, laser microsintering, screen printing and/or tampon printing. It is hereby particularly preferred that the application of the nucleation layer is implemented with a liquid-assisted laser, the processing reagent containing at least one metal compound.

There is preferably used as metal compound during the metallisation a compound from the group of metals consisting of silver, aluminium, nickel, titanium, molybdenum, tungsten and chromium. There is used particularly preferably as metal compound silver cyanide, silver acetate, silver nitrate and solutions thereof.

If a laser beam is used when applying the nucleation layer, then the latter can catalyse the metallisation in the region of the substrate covered with liquid on the surface. The metallisation can thereby be continued until the desired total strength is achieved or else is stopped after growth of a thin layer of a few nanometers and subsequently is thickened galvanically.

The last-described variant enables a total method in which for example a silicon wafer can be structured, doped and metallised in a single processing station, only exchanging the liquids used.

The nucleation layer is preferably applied on the doped regions of the silicon wafer.

Relative to the metallisation methods known from the state of the art, the following aspects above all can be regarded as advantageous developments of previous processes:

1) With the new method, both opening of the nitride layers, doping and nucleation or coating of the highly doped regions can be performed simultaneously in a single process step. Above all the doping with one and the same technical device, which takes place at the same time as the structuring of the nitride, represents an advantageous development relative to the previous BC solar cell contacting process.
2) By skilful choice of doping/metallising solution, damage etches of the produced channels, which take place in parallel with the doping/metallising, can even be undertaken.
3) As a result of the special mechanism in the contacting, the contact qualities can be improved, which manifest themselves on the one hand in better adhesion, on the other hand in a reduction in the contact resistance, caused by nickel silicide formation on the contact faces, as a result of which a further sintering process is no longer absolutely necessary even at this point in the process.
4) The apparatus used likewise dispenses with additional heating of the doping/metallising solutions.

A further preferred variant provides that the steps for the precision processing of the substrate comprise microstructuring, doping and application of the nucleation layer, these individual steps being able to be implemented in succession or in parallel.

In a further preferred variant of the method according to the invention, a rear-side contacting is applied after application of the nucleation layer. This can be effected particularly preferably by vapour deposition or sputtering. It is likewise possible that, after application of the nucleation layer, an additional rear-side contacting is applied by means of laser-fired rear-side contacting (LFC).

A further preferred variant provides that, after application of the nucleation layer, a thermal treatment is effected, in particular at temperatures of 100° C. to 900°. This thermal treatment can be effected for example by means of laser annealing with point or line focus.

In a further precision processing according to the invention, subsequent to the application of the nucleation layer, thickening of the nucleation layer can be effected. This thickening is effected preferably by galvanic deposition, e.g. of Ag, or by currentless deposition, e.g. of Cu.

It is particularly preferred to provide a total process for the production of solar cells, in which several or all of the previously mentioned method steps are implemented in succession or in parallel. Hence, a total process is possible, in which microstructuring, doping, application of a nucleation layer and thickening of the nucleation layer are effected.

The method according to the invention is suitable in particular for different method steps in the process chain for the production of solar cells. There are included herein emitter diffusion of silicon wafers, also the microstructuring of substrates, doping thereof and application of nucleation layers on silicon wafers.

The following 6 process sequences (A-F) are possible by means of the method according to the invention. There are used in the following the abbreviation LAL (Liquid-Assisted Laser) as generic term for all liquid-assisted laser methods with reactive carrier liquids.

The process sequences begin with cleaned wafers which have been cleared of sawing damage and possibly textured. Individual steps which are not absolutely necessary for the total sequence are characterised by "(optional)".

A: Emitter Diffusion, Passivation, Passivation Laser Opening, Growing Nucleation Layer and Thickening Diffusion of selective emitters (layer resistance <30 Ω/sq), e.g. by masking oxidation, structuring via photolithography, $POCl_3$ diffusion in a tube furnace, etching phosphorus silicate glass in hydrofluoric acid (optional).

Diffusion of flat emitters (layer resistance 40-300 Ω/sq), e.g. via $POCl_3$ diffusion in a tube furnace, etching phosphorus silicate glass in hydrofluoric acid. Alternatively, an emitter can be grown epitaxially.

Removal of parasitic emitters: via inline wet chemistry, e.g. one-sided etching in $HF/HNO_3$ mixtures (optional).

Deposition of one or more dielectric layers on the front-side and/or rear-side: e.g. via vapour deposition, PECVD methods or sputtering. Layer materials, e.g. $SiN_x$, $SiO_2$, $SiO_x$, $MgF_2$, $TiO_2$, $SiC_x$.

Local microstructuring/opening dielectric layer: via conventional lasers, water-jet-guided lasers, LAL (etching agent adapted to etching effect relative to dielectric layer or relative to silicon) or aerosol jets of phosphoric acid.

Tempering at 100-900° C. for 0.5-30 min, e.g. in a tube furnace, continuous furnace or via laser annealing with conventional lasers with point or line focus (optional).

Application of the rear-side contact, e.g. via screen printing of metal-containing pastes and firing or vapour deposition of metal layer systems and LFC process (laser fired contacts) (optional).

Conditioning of the surface for removing disruptive surface layers, e.g. native $SiO_2$ via short wet-chemical step, e.g. HF-dip (optional).

Application of the nucleation layer: by currentless Ni deposition in the dark or with conventional illumination, LAL with metal-containing liquid, inkjetting, aerosol spraying, vapour deposition, laser sintering of metal powders, screen- or tampon printing of fritless metal pastes.

Application of the rear-side contact, e.g. via screen printing of metal-containing pastes and firing or vapour deposition of metal layer systems and LFC process (laser fired contacts) (optional, if still not applied previously).

Tempering at 100-900° C. for 0.5-30 min, e.g. in a tube furnace, continuous furnace or via laser annealing with conventional lasers with point or line focus (optional).

Contact thickening: via galvanics, e.g. Ag galvanics in cyanide baths or currentless metal deposition (e.g. Cu).

B: Emitter Diffusion, Growing Local Nucleation Layer and Thickening, Passivating Diffusion of selective emitters (layer resistance<30 Ω/sq), e.g. via masking oxidation, structuring via photolithography, $POCl_3$ diffusion in a tube furnace, etching phosphorus silicate glass in hydrofluoric acid (optional).

Diffusion of flat emitters (layer resistance 40-300 Ω/sq), e.g. via $POCl_3$ diffusion in a tube furnace, etching phosphorus silicate glass in hydrofluoric acid. Alternatively, an emitter can be grown epitaxially.

Removal of parasitic emitters: via inline wet chemistry, e.g. one-sided etching in $HF/HNO_3$ mixtures (optional).

Tempering at 100-900° C. for 0.5-30 min, e.g. in a tube furnace, continuous furnace or via laser annealing with conventional lasers with point or line focus (optional).

Application of the rear-side contact, e.g. via screen printing of metal-containing pastes and firing or vapour deposition of metal layer systems and LFC process (laser fired contacts) (optional).

Conditioning of the surface for removing disruptive surface layers, e.g. native $SiO_2$ via short wet-chemical step, e.g. HF-dip (optional).

Application of the nucleation layer: by currentless Ni deposition with local conventional illumination, LAL with metal-containing liquid, inkjetting, aerosol spraying, vapour deposition, laser sintering of metal powders, screen- or tampon printing of fritless metal pastes.

Application of the rear-side contact, e.g. via screen printing of metal-containing pastes and firing or vapour deposition of metal layer systems and LFC process (laser fired contacts) (optional, if still not applied previously).

Tempering at 100-900° C. for 0.5-30 min, e.g. in a tube furnace, continuous furnace or via laser annealing with conventional lasers with point or line focus (optional).

Contact thickening: via galvanics, e.g. Ag galvanics in cyanide baths or currentless metal deposition (e.g. Cu).

Deposition of one or more dielectric layers on the front-side and/or rear-side: e.g. via vapour deposition, PECVD methods or sputtering. Layer materials, e.g. $SiN_x$, $SiO_2$, $SiO_x$, $MgF_2$, $TiO_2$, $SiC_x$.

C: Emitter Diffusion, Passivation, Passivation Opening and Local Doping with LAL, Growing Nucleation Layer and Thickening Diffusion of flat emitters (layer resistance 40-300 Ω/sq), e.g. via $POCl_3$ diffusion in a tube furnace, etching phosphorus silicate glass in hydrofluoric acid. Alternatively, an emitter can be grown epitaxially.

Removal of parasitic emitters: via inline wet chemistry, e.g. one-sided etching in $HF/HNO_3$ mixtures (optional).

Deposition of one or more dielectric layers on the front-side and/or rear-side: e.g. via vapour deposition, PECVD methods or sputtering. Layer materials, e.g. $SiN_x$, $SiO_2$, $SiO_x$, $MgF_2$, $TiO_2$, $SiC_x$.

Local microstructuring/opening dielectric layer with simultaneous local high doping via LAL (etching agent adapted to etching effect relative to dielectric layer or relative to silicon).

Tempering at 100-900° C. for 0.5-30 min, e.g. in a tube furnace, continuous furnace or via laser annealing with conventional lasers with point or line focus (optional).

Application of the rear-side contact, e.g. via screen printing of metal-containing pastes and firing or vapour deposition of metal layer systems and LFC process (laser fired contacts) (optional).

Conditioning of the surface for removing disruptive surface layers, e.g. native $SiO_2$ via short wet-chemical step, e.g. HF-dip (optional).

Application of the nucleation layer: by currentless Ni deposition in the dark or with conventional illumination, LAL with metal-containing liquid, inkjetting, aerosol spraying, vapour deposition, laser sintering of metal powders, screen- or tampon printing of fritless metal pastes.

Application of the rear-side contact, e.g. via screen printing of metal-containing pastes and firing or vapour deposition of metal layer systems and LFC process (laser fired contacts) (optional, if still not applied previously).

Tempering at 100-900° C. for 0.5-30 min, e.g. in a tube furnace, continuous furnace or via laser annealing with conventional lasers with point or line focus (optional).

Contact thickening: via galvanics, e.g. Ag galvanics in cyanide baths or currentless metal deposition (e.g. Cu).

D: LAL Simultaneously of Flat and Deep Emitters, Growing Nucleation Layer and Thickening Local high doping via LAL (etching agent adapted to etching effect relative to dielectric layer or relative to silicon), then drying of the liquid which is wetting the wafer as dopant for a subsequent flat, weak doping.

Tempering at 100-900° C. for 0.5-30 min, e.g. in a tube furnace, continuous furnace or via laser annealing with conventional lasers with point or line focus (optional) in order to diffuse the flat emitter.

Application of the rear-side contact, e.g. via screen printing of metal-containing pastes and firing or vapour deposition of metal layer systems and LFC process (laser fired contacts) (optional).

Conditioning of the surface for removing disruptive surface layers, e.g. native $SiO_2$ via short wet-chemical step, e.g. HF-dip (optional).

Application of the nucleation layer: by currentless Ni deposition with local conventional illumination, LAL with metal-containing liquid, inkjetting, aerosol spraying, vapour deposition, laser sintering of metal powders, screen- or tampon printing of fritless metal pastes.

Application of the rear-side contact, e.g. via screen printing of metal-containing pastes and firing or vapour deposition of metal layer systems and LFC process (laser fired contacts) (optional, if still not applied previously).

Tempering at 100-900° C. for 0.5-30 min, e.g. in a tube furnace, continuous furnace or via laser annealing with conventional lasers with point or line focus (optional).

Contact thickening: via galvanics, e.g. Ag galvanics in cyanide baths or currentless metal deposition (e.g. Cu).

Deposition of one or more dielectric layers on the front-side and/or rear-side: e.g. via vapour deposition, PECVD methods or sputtering. Layer materials, e.g. $SiN_x$, $SiO_2$, $SiO_x$, $MgF_2$, $TiO_2$, $SiC_x$.

E: Emitter Diffusion, Passivation, LAL Opening+Doping+Simultaneous Nucleation Layer Deposition, Thickening Diffusion of flat emitters (layer resistance 40-300 Ω/sq), e.g. via $POCl_3$ diffusion in a tube furnace, etching phosphorus silicate glass in hydrofluoric acid. Alternatively, an emitter can be grown epitaxially.

Removal of parasitic emitters: via inline wet chemistry, e.g. one-sided etching in HF/HNO$_3$ mixtures (optional).

Deposition of one or more dielectric layers on the front-side and/or rear-side: e.g. via vapour deposition, PECVD methods or sputtering. Layer materials, e.g. SiN$_x$, SiO$_2$, SiO$_x$, MgF$_2$, TiO$_2$, SiC$_x$.

Opening dielectric layer, local high doping and depositing nucleation layer via LAL.

Application of the rear-side contact e.g. via screen printing of metal-containing pastes and firing or vapour deposition of metal layer systems and LFC process (laser fired contacts) (optional).

Tempering at 100-900° C. for 0.5-30 min, e.g. in a tube furnace, continuous furnace or via laser annealing with conventional lasers with point or line focus (optional).

Contact thickening: via galvanics, e.g. Ag galvanics in cyanide baths or currentless metal deposition (e.g. Cu).

F: Emitter Diffusion, Passivation, LAL Opening+Doping+Simultaneous Nucleation Layer Deposition, Nucleation Layer Completion, Thickening Diffusion of flat emitters (layer resistance 40-300 Ω/sq), e.g. via POCl$_3$ diffusion in a tube furnace, etching phosphorus silicate glass in hydrofluoric acid. Alternatively, an emitter can be grown epitaxially.

Removal of parasitic emitters: via inline wet chemistry, e.g. one-sided etching in HF/HNO$_3$ mixtures (optional).

Deposition of one or more dielectric layers on the front-side and/or rear-side: e.g. via vapour deposition, PECVD methods or sputtering. Layer materials, e.g. SiN$_x$, SiO$_2$, SiO$_x$, MgF$_2$, TiO$_2$, SiC$_x$.

Opening dielectric layer, local high doping and depositing nucleation layer via LAL.

Completion of the nucleation layer: by currentless Ni deposition with local conventional illumination, LAL with metal-containing liquid, inkjetting, aerosol spraying, vapour deposition, laser sintering of metal powders, screen- or tampon printing of fritless metal pastes. This step serves for completion of the possibly non-continuous nucleation layer which was applied in the previous step. By means of the 2-stage process, the adhesion on the substrate can be increased since the LAL process introduces the metal atoms into the liquid silicon.

Application of the rear-side contact, e.g. via screen printing of metal-containing pastes and firing or vapour deposition of metal layer systems and LFC process (laser fired contacts) (optional).

Tempering at 100-900° C. for 0.5-30 min, e.g. in a tube furnace, continuous furnace or via laser annealing with conventional lasers with point or line focus (optional).

Contact thickening: via galvanics, e.g. Ag galvanics in cyanide baths or currentless metal deposition (e.g. Cu).

The subject according to the invention is intended to be explained in more detail with reference to the subsequent examples, without wishing to restrict the latter to the special embodiments shown here. All the total processes described in these examples can also be reduced to partial processes thereof by a simplified liquid composition. Thus for example a silicon nitride structuring with simultaneous doping can be effected even without metallisation if the metal salt is not added to the solution.

EXAMPLE 1

Nitride Structuring/Doping and Nucleation with a Solution of Hypophosphite, Phosphoric Acid and a Metal Salt In one embodiment of the present invention, all three chemical systems from the three individual steps are combined and the concentrations thereof are adapted to the new system. Contrary to the concept is the fact that the interactions of the reagents with each other from the individual process steps, which reagents do not contain phosphorus, are low. Thus for example metal ions in no way impede the phosphorus glass formation and also not the etching effect of the phosphoric acid on the silicon nitride. Hydrogen phosphates and hypophosphite ions together form an effective redox pair which is able to reduce metal ions. The low pH value of the solution and the presence of the hydrogen phosphate ions reduces the reduction potential of the hypophosphite, which initially is not undesired because, as a result, the danger of spontaneous decomposition of the reaction bath, as is the case with baths for currentless deposition of nickel, is significantly reduced.

However, the hypophosphorous acid involves only a very weak acid with a very low boiling point. The low acid strength of the hypophosphorous acid ensures however that the proton concentration is now determined almost exclusively by the phosphoric acid concentration in the solution which, for its part, must not turn out to be too high because the reduction potential of the hypophosphite consequently reduces too greatly to continue to be able to reduce metal ions. The concentration leeway of the individual components is accordingly unrestricted in such a system. The low boiling point of the hypophosphorous acid furthermore makes management thereof difficult and increases the danger of a gradual reduction in concentration in the system by evaporation of this component which is important for the total system. Very high concentrations of hypophosphite in solution reduce the durability of the liquid medium, which represents a significant problem for commercial use. The chemical system with hypophosphite as reduction agent accordingly proves to be exceptionally unstable, but still very effective if no great durability of the solution is required.

In the presented example, the following component systems can be used inter alia:

[NiCl$_2$.6H$_2$O]=0.1-1 mol/l

[NaH$_2$PO$_2$.H$_2$O]=0.1-5 mol/l

[H$_3$PO$_4$]=0.5-5 mol/l

Complex formers for Ni$^{2+}$ ions and buffers, e.g.: hydroxyacetic acid with: [HOCH$_2$COOH]=0.5-2 mol/l

EXAMPLE 2

Nitride Structuring/Doping and Nucleation with a Solution of Phosphorous Acid, Phosphoric Acid and a Metal Salt Systems consisting of phosphoric acid and phosphorous acid with water-soluble nickel salts as metal sources, e.g.: nickel chlorides NiCl$_2$.x H$_2$O, nickel sulphates NiSO$_4$.x H$_2$O or nickel nitrates Ni (NO$_3$)$_2$.x H$_2$O are more stable relative to spontaneous decomposition. The pH value of such systems is adjusted with the help of potassium hydroxide solution or even better ammonium hydroxide solution. Generally it is in the slightly acidic range.

HPO$_3^{2-}$ ions from phosphorous acid and HPO$_4^{2-}$ ions from phosphoric acid together form a redox pair. The second redox pair is formed by the nickel in the form Ni$^{2+}$/Ni$^0$:

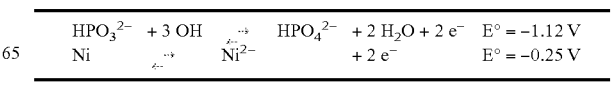

In basic media the $HPO_3^{2-}$ ion is a strong reduction agent, just like hypophosphite, i.e. it is then able to reduce ions of a few less noble metals into elementary metal, which is however not effected so spontaneously as with hypophosphite because of the lower reduction potential of the phosphate ion in which the phosphorus has the oxidation step +III, relative to the hypophosphite where it is +I. A spontaneous reduction of $Ni^{2+}$ ions with phosphoric acid is rarely observed in aqueous solutions. On hot catalytically acting surfaces, oxidation of the phosphite ion into phosphate with reduction of metal ions, even those of nickel, is in contrast readily possible.

Phosphorous acid relative to hypophosphorous acid has furthermore two further essential advantages:

1) It has a significantly higher boiling point than hypophosphorous acid and evaporates therefore far less rapidly.

2) It is a substantially stronger acid and hence, similarly to phosphoric acid, a more effective etching agent for the silicon nitride than hypophosphorous acid.

Thermodynamic Promotion of the Redox Process for the Metal Deposition:

The reduction capacity (the electromotive force of the $HPO_3^{2-}/HPO_4^{2-}$ system) of a solution containing $HPO_3^{2-}$ ions is dependent upon the activities of the mentioned ions in the solution and upon the pH value of the solution, more precisely, of the hydroxide ion concentration. This is evident from the Nernst equation for the $HPO_3^{2-}/HPO_4^{2-}$ system:

$$\Delta E(HPO_3^{2-}/HPO_4^{2-}) = -1,12V + \frac{0,059}{2} \cdot \log\frac{a(HPO_4^{2-})}{a(HPO_3^{2-}) \cdot a(OH^-)^3} V$$

In diluted solutions, the activity a of the individual species should be equated to the concentration c thereof of the respective species in the solution. The higher the $HPO_3^{2-}$ ion concentration and/or the higher the pH value, the more negative does $\Delta E$ ($HPO_3^{2-}/HPO_4^{2-}$) become, i.e. all the more does the reduction capacity of the half cell increase.

The EMF of a half cell can however also be influenced via the temperature, evident from the general form of the Nernst equation:

$$\Delta E = E^\circ + \frac{RT}{zF} \cdot lg\frac{a_{Ox}}{a_{Red}}$$

with: $\Delta E$=electromotive force (EMF); $E^\circ$=normal potential (EMF under standard conditions); R=ideal gas constant=8.31451 $JK^{-1}$ $mol^{-1}$; T=absolute temperature in Kelvin; z=charge equivalent (number of exchanged electrons per formula unit); F=Faraday constant=96485 A x s; $a_{Ox}$ and $a_{Red}$=concentrations of the oxidised and of the reduced species.

With increasing temperature, the reduction capacity of the half cell also rises accordingly. The denominator of the logarithmic term of the NERNST equation then becomes greater relative to the numerator because the activity of the hydroxide ions has an influence on the denominator to the power three.

Kinetic Promotion of the Redox Process for the Metal Deposition:

The acceleration of the reaction speed of a chemical reaction, included herein also the redox reaction observed here, is evident from the Arrhenius relationship which describes the speed constant k of a reaction as a function of the temperature:

$$k = A \cdot e^{-\frac{E_A}{RT}}$$

with: k=speed constant, A=reaction-specific pre-exponential factor, $E_A$=activation energy, R=general gas constant, T=absolute temperature in Kelvin.

In the reactive liquid, the concentrations of the individual species are coordinated with each other during the process such that they do not react with each other under standard conditions in the given time window from preparation of the solution until processing of the surface. For this purpose, the voltage between the redox systems $Ni^{2+}/Ni^0$ and $HPO_3^{2-}/HPO_4^{2-}$ must be maintained sufficiently low, which can be effected via the adjustment of the pH value or of the concentrations of the species involved in the solution.

If now the solution flows onto the silicon nitride surface which is heated by the laser beam and melted, then various processes thereby take place in succession:

1) Firstly, a part of the melt is driven out and rinsed away by the convection current. The melt removed in this way is subjected over a large active surface to the etching agent phosphoric acid/phosphorous acid and is dissolved by this so that it does not become deposited, as in the case of dry silicon nitride removal with lasers situated at the edge of the cut notch. Very clean cut grooves are consequently produced.

2) As long as a silicon melt is present, the phosphorus sources present in the liquid can issue, by pure thermal decomposition, the phosphorus contained therein to the silicon; this is melted to a certain degree into the silicon, likewise a part of the metal ions entrained in the liquid, in the present case, the nickel ions. In the molten silicon, the diffusion rate of the phosphorus is in addition very high. The incorporation of phosphorus is effected all the better the smaller is the oxidation step thereof because then the fewer the electrons which must be transmitted from the system to the phosphorus, the more electronegative is the bond partner as dopant in the silicon crystal relative to the silicon. By means of the convection current, the doping and metallisation mixture is thoroughly mixed effectively with the silicon melt, where it solidifies together with the melt, consequently is included and finally incorporated directly in part in the silicon crystal. In this way, optionally even when travelling over the cut notch once, very high doping depths of several µm can be achieved, as a function of the melt depth at the cutting point. A further part of the chemical mixture remains included as phosphorus silicate glass islands below the surface and can serve as further doping source for the silicon within a tempering step. The likewise locally included nickel in a very large quantity thereby alloys locally with the silicon to form $Ni_2Si$, as a result of which it contributes to reducing the contact resistance.

3) Because of the high heat conductivity of silicon, above all in the liquid state in which it has metallic properties, the temperature of the silicon subsides relatively rapidly. On the silicon surface, a phosphorus silicate glass is also thereby formed, the network former of which is a three-dimensional network consisting of silicon- and phosphorus atoms which are connected to each via oxygen bridges. A statistical part of the oxygen atoms has only one bond partner and a free valency with a negative charge. $Ni^{2+}$ ions from the solution form the charge equalisation for this purpose, said ions being bonded consequently electrostatically to the surface. During a further transfer step, they can diffuse out of the phosphorus silicate glass into the uppermost silicon layer and form deposition nuclei for further nickel atoms there. During doping of the silicon with the help of phosphorus silicate glass, phosphoric acid relative to phosphorous acid proves its worth as the more favourable source of phosphorus because all the valencies of phosphorus therein are saturated with oxygen atoms which are required for network formation in the glass.

4) In the course of the reduction in the high temperatures on the silicon surface, also that temperature range is passed through, in which only thermal activation of the above-mentioned redox process between the phosphorous acid and the nickel ions in solution is effected but not direct melting of the components as at the beginning of the process. Due to the solution present in the cut notch, now thickening of the metal nucleation layer can take place on the surface in that the above-portrayed redox reaction takes place locally on the nucleated and highly doped silicon surface.

The phosphorus silicate glass on the walls of the cut notch acts disadvantageously as insulator on the contact resistance of the solar cell, therefore it must be removed again in the course of the total process after the doping is completed. This can take place in parallel to the doping and nucleation process in that small quantities of hydrofluoric acid are added to the reaction mixture. In such cases however, the thickening of the nuclei cannot then be undertaken with one and the same solution which was used for the preceding process steps (nitride removal, doping, nucleation) because, in the presence of hydrofluoric acid, a pronounced tendency exists for a renewed dissolution of already deposited, elementary metal. The thickening of the contacts in such cases can be performed within a subsequent step in which, with the help of the liquid-assisted laser method, standard nickel solutions are introduced for the currentless deposition of nickel in the cut notches and the cut notches are thereby heated locally with the help of the laser. The local deposition of the metal is thereby influenced by two factors: 1. the high doping and already present nucleation of the channel walls which act hence catalytically and 2. the thermal or photochemical activation of the deposition process by the laser.

In the presented example, the following component systems inter alia can be used:

$$pH=6.5 \Rightarrow [OH^-]=3.16\times10^{-7} \text{ mol/l} \quad 1)$$

$$[HPO_4^{2-}]=5 \text{ mol/l}$$

$$[HPO_3^{2-}]=10^{-3} \text{ mol/l}$$

$$[Ni^{2+}]=5-7 \text{ mol/l}$$

The voltage U between half cells $Ni^0\|Ni^{2+})$ and $(HPO_3^{2-}\|HPO_4^{2-})$ is then +0.205 V $$pH=4 \Rightarrow [OH^-]=10^{-10} \text{ mol/l} \quad 2)$$

$$[HPO_4^{2-}]=10^{-3} \text{ mol/l}$$

$$[HPO_3^{2-}]=6 \text{ mol/l}$$

$$[Ni^{2+}]=5 \text{ mol/l}$$

The voltage U between the half cells $(Ni^0\|Ni^{2+})$ and $(HPO_3^{2-}\|HPO_4^{2-})$ is here +0.12 V $$pH=6 \Rightarrow [OH^-]=10^{-8} \text{ mol/l} \quad 3)$$

$$[HPO_4^{2-}]=1 \text{ mol/l}$$

$$[HPO_3^{2-}]=5\times10^{-2} \text{ mol/l}$$

$$[Ni^{2+}]=1-5 \text{ mol/l}$$

The voltage U between the half cells $(Ni^0\|Ni^{2+})$ and $(HPO_3^{2-}\|HPO_4^{2-})$ is in this case +0.10 to +0.12 V $$pH=5 \Rightarrow [OH^-]=10 \text{ mol/l} \quad 4)$$

$$[HPO_4^{2-}]=1 \text{ mol/l}$$

$$[HPO_3^{2-}]=10^{-1} \text{ mol/l}$$

$$[Ni^{2+}]=1-3 \text{ mol/}$$

The voltage U between the half cells $(Ni^0\|Ni^{2+})$ and $(HPO_3^{2-}\|HPO_4^{2-})$ is here +0.04 V

EXAMPLE 3

Nitride Structuring/Doping/Nucleation and Damage Etch with a Chemical System Consisting of: KOH Solution, Hydrogen Phosphate Salt, Metal Salt According to choice of the laser wavelength, during processing of the contact channels, damage in the crystalline structure with a different penetration depth can be produced, which is undesired because of the factor thereof of reducing quality on the electrical properties of the solar cells. In the case of BC solar cells, this damage is removed again after preparing the channels by an additional damage etch step before the metallisation step is implemented.

In the present invention, this damage etch can be effected in parallel with the three partial processes: nitride opening/doping/nucleation in that the chemical system used for this purpose is adapted. Reference may be made at this point once again to the works of Baumann et al. 2006 in which it was shown that, with the liquid-jet-guided laser method based on KOH solutions, damage-free removal of silicon is possible. This can also be expected for any standing liquid.

Starting with the assumption that the nitride removal can also be implemented extensively by a purely thermal ablation of the nitride and that a metal nucleation of the doped silicon surface is conceivable even without reduction of the metal ions with the help of a phosphorus compound, the chemical systems presented in embodiments 1-2 can be modified in that the phosphorus-containing compounds are used exclusively for the phosphorus doping. There serves as phosphorus source in this context a hydrogen phosphate salt, e.g. lithium hydrogen phosphate which is dissolved in a potassium hydroxide solution. The metal source is a nickel salt, e.g. nickel chloride. Because of the fact that $Ni(OH)_2$ precipitates in the basic range, a complex former for the nickel ions must also be added to the solution, e.g. ammonia, with which these form the $[Ni(NH_3)_6]^{2+}_{(aq)}$ complex which is stable in basic media.

Doping and nucleation are effected here as described in example 2 in points 1)-3). The damage etch is undertaken by potassium hydroxide ions which are located in the supernatant solution in the still heated cut channels during the process, whilst the laser beam is moved on further. Lithium ions, which are incorporated likewise locally at the contact points during the melting and solidifying process in the silicon crystal, reduce the contact resistance of the solar cell in addition.

The metal nucleation layer can be thickened, in a further process step, either by standard currentless nickel deposition or by other methods, for instance with the help of the Optomec® process.

In the presented example, the following component systems inter alia can be used:

Content of the KOH solution: 2-20% by weight

[$Li_2HPO_4$]=0.1-5 mol/l

[$Ni^{2+}$]=1 mol/l approx. 20 ml conc. $NH_3$ solution/l solution

EXAMPLE 4

Nitride Structuring/Doping and Damage Etch without Metal Nucleation with Chemical Systems Consisting of Phosphoric Acid, Nitric Acid/Hydrofluoric Acid If a metal nucleation in the course of the nitride structuring and simultaneous doping is dispensed with and if this is only implemented in a subsequent step, then a mixture of $HF/HNO_3$ can be used as damage etch reagent which is added to the phosphoric acid. $HF/HNO_3$, relative to KOH, has the advantage as damage etch reagent of a much higher etching rate and more isotropic etching properties.

In the presented example, the following component systems inter alia can be used:

Content of the phosphoric acid solution: 80-87% by weight

HF (49%): 35 ml/l solution $HNO_3$ (70%): 15 ml/l solution

The invention claimed is:

1. A method for the precision processing of substrates, in which a laser beam directed towards a substrate surface is guided over at least one region of the substrate to be processed, wherein the substrate is covered at least at the processing region of the substrate by a liquid comprising a processing reagent, wherein the substrate is selected from the group consisting of silicon, glass, metal, ceramic, plastic material and composites thereof, wherein at least one dielectric layer is deposited on the substrate for passivation before the precision processing, and wherein a microstructuring of the dielectric layer is effected during the precision processing.

2. The method according to claim 1, wherein the substrate is immersed in the liquid comprising the processing reagent.

3. The method according to claim 1, wherein the substrate has one or more coatings on the surface to be treated.

4. The method according to claim 1, wherein the laser beam is adjusted actively in temporal and/or spatial pulse form.

5. The method according to claim 1, wherein, during the precision processing, an emitter diffusion of a dopant in a silicon wafer as substrate is implemented.

6. The method according to claim 5, wherein the dopant is selected from the group consisting of phosphorus, boron, indium, gallium and mixtures thereof.

7. The method according to claim 5, wherein the emitter diffusion is implemented with a liquid comprising $POCl_3$.

8. The method according to claim 5, wherein subsequently parasitically deposited dopants are removed again.

9. The method according to claim 5, wherein, during the emitter diffusion, a doping of the substrate is effected only in regions.

10. The method according to claim 1, wherein the dielectric layer is selected from the group consisting of $SiN_x$, $SiO_2$, $SiO_x$, $MgF_2$, $TiO_2$ and $SiC_x$.

11. The method according to claim 1, wherein the dielectric layer is opened by treatment with a dry laser or a water-jet-guided laser.

12. The method according to claim 1, wherein the dielectric layer is opened by treatment with the laser and the processing reagent is a liquid comprising an etching agent which has a stronger etching effect on the dielectric layer than on the substrate.

13. The method according to claim 1, wherein the dielectric layer is opened by treatment with the laser and in that the processing reagent is a liquid comprising an etching agent with which damage in the substrate is subsequently etched.

14. The method according to claim 12, wherein the etching agent is selected from the group consisting of $H_3PO_4$, KOH, $HF/HNO_3$, chlorine compounds and sulphuric acid.

15. The method according to claim 12, wherein the liquid further comprises a reduction agent.

16. The method according to claim 15, wherein the etching agent and the reduction agent contain the same chemical element in different oxidation stages.

17. The method according to claim 16, wherein the etching agent contains $H_3PO_4$ and the reduction agent $H_3PO_3$ or the etching agent contains $H_2SO_4$ and the reduction agent $H_2SO_3$ or the etching agent contains $HNO_3$ and the reduction agent $HNO_2$.

18. The method according to claim 12, wherein the liquid contains a phosphorus-containing substance.

19. The method according to claim 15, wherein the liquid further comprises a metal salt.

20. The method according to claim 1, wherein doping is produced in the substrate only in regions during the precision processing, subsequently liquid located on the substrate surface dries in and the substrate is treated thermally so that the substrate has a weak surface doping and high local doping introduced.

21. The method according to claim 20, wherein the dopant is selected from the group consisting of phosphoric acid, phosphorous acid, boron-, gallium-, nitrogen-, arsenic- and antimony compounds and mixtures thereof.

22. The method according to claim 1, further comprising applying a nucleation layer at least in regions on a silicon wafer during the precision processing.

23. The method according to claim 22, wherein, when applying the nucleation layer, a metallization can be catalyzed by the laser beam.

24. The method according to claim 22, wherein the nucleation layer is applied on the doped regions of the silicon wafer.

25. The method according to claim 22, wherein, after application of the nucleation layer, a rear-side contacting is applied.

26. The method according to claim 25, wherein, after application of the nucleation layer, an additional rear-side contacting is applied by a laser-fired rear-side contacting (LFC).

27. The method according to claim 22, wherein, after the precision processing and subsequent to the application of the nucleation layer, the nucleation layer is thickened.

28. The method according to claim 27, wherein the nucleation layer is thickened by galvanic deposition or by currentless deposition.

* * * * *

UNITED STATES PATENT AND TRADEMARK OFFICE
CERTIFICATE OF CORRECTION

PATENT NO. : 8,586,402 B2
APPLICATION NO. : 12/530167
DATED : November 19, 2013
INVENTOR(S) : Mayer et al.

It is certified that error appears in the above-identified patent and that said Letters Patent is hereby corrected as shown below:

On the title page, under "Assignees," item (73) should read as follows:

"Fraunhofer-Gesellschaft zur Förderung der angewandten Forschung e.V., München (DE);
Albert-Ludwigs-Universität Freiburg, Freiburg (DE)"

Signed and Sealed this
Fifteenth Day of April, 2014

Michelle K. Lee
*Deputy Director of the United States Patent and Trademark Office*

UNITED STATES PATENT AND TRADEMARK OFFICE
CERTIFICATE OF CORRECTION

PATENT NO.       : 8,586,402 B2                                    Page 1 of 1
APPLICATION NO. : 12/530167
DATED            : November 19, 2013
INVENTOR(S)      : Mayer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 678 days.

Signed and Sealed this

Twenty-second Day of September, 2015

Michelle K. Lee
*Director of the United States Patent and Trademark Office*